(12) United States Patent
Richardson et al.

(10) Patent No.: US 8,668,774 B2
(45) Date of Patent: Mar. 11, 2014

(54) LOW TEMPERATURE CONTINUOUS CIRCULATION REACTOR FOR THE AQUEOUS SYNTHESIS OF ZNO FILMS, NANOSTRUCTURES, AND BULK SINGLE CRYSTALS

(75) Inventors: Jacob J. Richardson, Santa Barbara, CA (US); Frederick F. Lange, Santa Barbara, CA (US); MaryAnn E. Lange, legal representative, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 676 days.

(21) Appl. No.: 12/761,246

(22) Filed: Apr. 15, 2010

(65) Prior Publication Data

US 2010/0263586 A1    Oct. 21, 2010

Related U.S. Application Data

(60) Provisional application No. 61/169,633, filed on Apr. 15, 2009.

(51) Int. Cl.
*C30B 19/00* (2006.01)
(52) U.S. Cl.
USPC .............. 117/64; 117/54; 117/56; 117/65
(58) Field of Classification Search
USPC ........................................ 117/64, 54, 56, 65
See application file for complete search history.

(56) References Cited

U.S. PATENT DOCUMENTS

| 3,721,611 | A * | 3/1973 | Jones ........................... 205/348 |
| 6,458,673 | B1 * | 10/2002 | Cheung ......................... 438/479 |
| 2003/0084838 | A1 * | 5/2003 | McCandlish et al. .......... 117/68 |
| 2004/0265507 | A1 * | 12/2004 | Xiong et al. .................. 427/561 |
| 2007/0287194 | A1 * | 12/2007 | Childs et al. .................. 436/181 |

OTHER PUBLICATIONS

Schmidt-Mende et al.; "ZnO—nanostructures, defects, and devices," Department of Materials Science, vol. 10, No. 5, May 2007, pp. 40-48.
Sounart et al.; "Sequential Nucleation and Growth of Complex Nanostructured Films," Advanced Functional Materials, vol. 16, 2006, pp. 335-344.
Perkins et al.; "A Liquid-Phase Quartz Crystal Microbalance for Photovoltaics Research," National Renewable Energy Laboratory, May 2008, pp. 1-8.
International Search Report for International Application No. PCT/US10/31286 filed on Apr. 15, 2010.
Elmmer, K. et al., "Resistivity of polycrystalline zinc oxide films: current status and physical limit," Journal of Physics D. 34(21), 2001, pp. 3097-3108.
Richardson, J. et al., "Controlling low temperature aqueous synthesis of ZnO. 1. Thermodynamic analysis," Crystal Growth & Design, vol. 9, No. 6, 2009, pp. 2570-2575.
Richardson, J. et al., "Controlling low temperature aqueous synthesis of ZnO. 2. A novel continuous circulation reactor," Crystal Growth & Design, vol. 9, No. 6, 2009, pp. 2576-2581.

(Continued)

*Primary Examiner* — James McDonough
(74) *Attorney, Agent, or Firm* — Gates & Cooper LLP

(57) ABSTRACT

A method for synthesizing ZnO, comprising continuously circulating a growth solution that is saturated with ZnO between a warmer deposition zone, which contains a substrate or seed, and a cooler dissolution zone, which is contains ZnO source material.

39 Claims, 7 Drawing Sheets

(56) References Cited

OTHER PUBLICATIONS

Richardson, J. et al., "Low temperature aqueous deposition of ZnO on Gan LEDs," presentation slides at SSLEC annual review, Nov. 2009, 17 pages.

Thompson, D. et al., "Light emitting diodes with ZnO current spreading layers deposited from a low temperature aqueous solution," Applied Physics Express 2, 2009, 042101-1-042101-3.

Van De Walle, C., "Hydrogen as a cause of doping in zinc oxide," Physical Review Letters 85(5), 2000, pp. 1012-1015.

Richardson et al., "Rapid synthesis of epitaxial ZnO films from aqueous solution using microwave heating", Journal of Materials Chemistry, The Royal Society of Chemistry 2010.

Chinese Office Action dated Sep. 3, 2013 for CN application No. 201080013116.9.

Perkins et al., "A Liquid-Phase Quartz Crystal Microbalance for Photovoltaics Research". National Renewable Energy Laboratory, Dec. 31, 2008, pp. 1-5.

Sounart et al., "Sequential Nucleation and Growth of Complex Nanostructured Films". Advanced Functional Materials, 2006, 16, pp. 335-344.

Schmidt-Mende et al., "ZnO—nanostructures, defects, and devices". Department of Materials Science, May 2007, vol. 10, No. 5, pp. 40-48.

\* cited by examiner

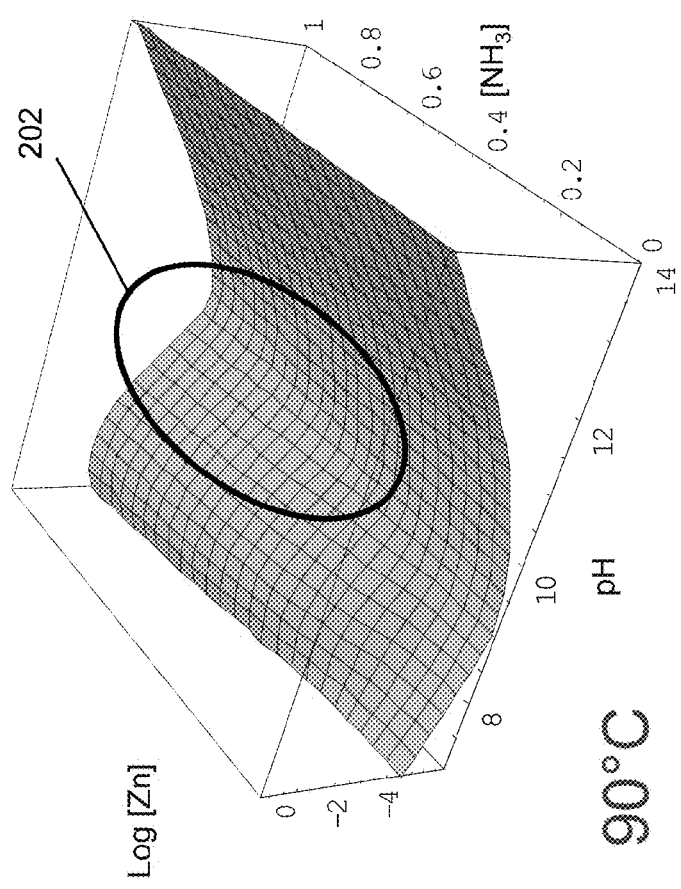

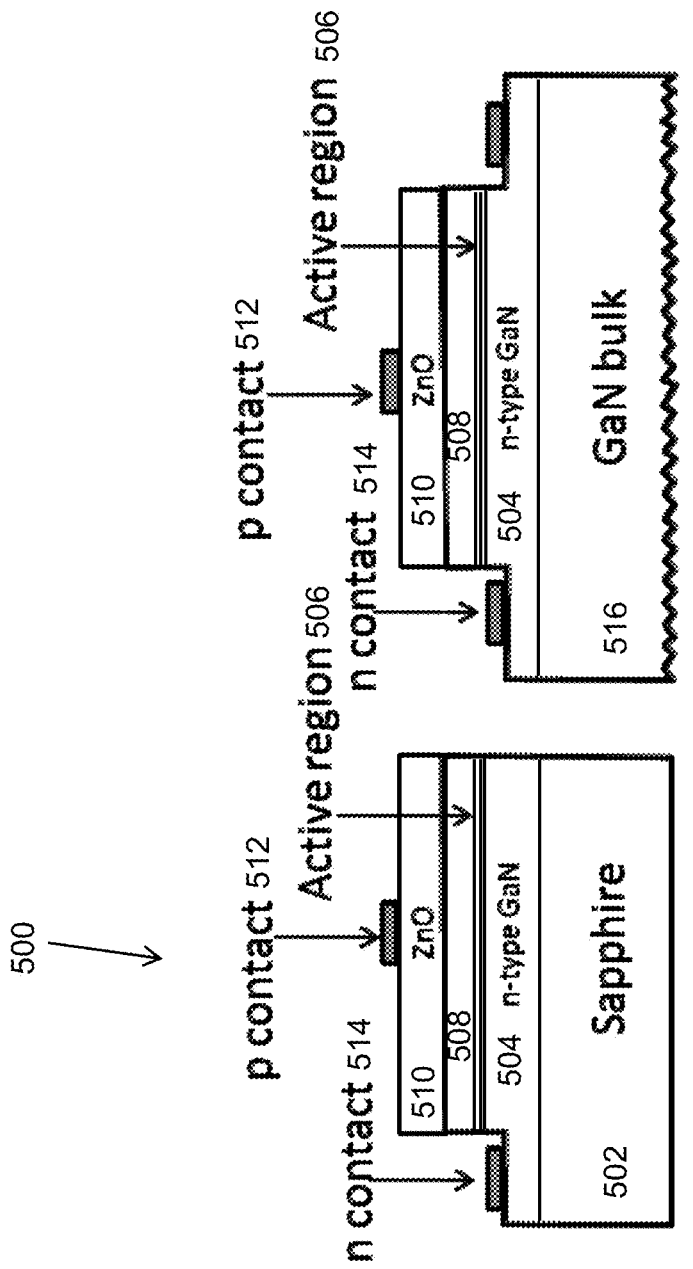

LOW TEMPERATURE CONTINUOUS CIRCULATION REACTOR FOR THE AQUEOUS SYNTHESIS OF ZNO FILMS, NANOSTRUCTURES, AND BULK SINGLE CRYSTALS

CROSS REFERENCE TO RELATED APPLICATIONS

This application claims the benefit under 35 U.S.C. Section 119(e) of co-pending and commonly assigned U.S. Provisional Patent Application Ser. No. 61/169,633, filed on Apr. 15, 2009, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS," which application is incorporated by reference herein.

This application is related to the following co-pending and commonly-assigned U.S. patent applications:

U.S. Provisional Application Ser. No. 61/257,811, filed on Nov. 3, 2009, by Jacob J. Richardson, Daniel B. Thompson, Ingrid Koslow, Jun Seok Ha, Frederick F. Lange, Steven P. DenBaars, and Shuji Nakamura entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,";

U.S. Provisional Application Ser. No. 61/257,812, filed on Nov. 3, 2009, by Daniel B. Thompson, Jacob J. Richardson, Ingrid Koslow, Jun Seok Ha, Frederick F. Lange, and Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION,"; and U.S. Provisional Application Ser. No. 61/257,814, filed on Nov. 3, 2009, by Daniel B. Thompson, Jacob J. Richardson, Steven P. DenBaars, Frederick F. Lange, and Jin Hyeok Kim, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION,";

which applications are incorporated by reference herein.

BACKGROUND OF THE INVENTION

1. Field of the Invention

This invention relates to ZnO, and a method and apparatus for fabricating the same.

2. Description of the Related Art (Note: This application references a number of different publications as indicated throughout the specification by one or more reference numbers within brackets, e.g., Ref [x]. A list of these different publications ordered according to these reference numbers can be found below in the section entitled "References." Each of these publications is incorporated by reference herein.)

There has recently been a surge of interest in zinc oxide (ZnO); but, in fact, the material has long been of importance for a wide variety of applications, from sunscreen and pigments, to rubber manufacturing and varistors. However, these historic applications of ZnO have usually only required powdered forms of ZnO, or the polycrystalline ceramics formed from consolidating and sintering ZnO powders. As such, the ZnO requirements of these applications have largely been met by the materials produced directly from Zn ores or metallic Zn in large scale, "French" or "American" type industrial processes. Much of the recent interest in ZnO stems from newly developed and yet to be developed potential applications in the electronics and renewable energy industries. Many of these emerging applications for ZnO will have more rigorous specifications on the form and quality of the ZnO used than typical historical applications. Rather than simple powder, many of these applications will require ZnO in the form of thin films, nanoparticles, single crystals, and epitaxial material. Current commercial methods for producing these advanced forms of ZnO often utilize high temperatures, high or low pressures, toxic and/or highly specialized chemicals, and complex equipment, all of which lead to a high cost of production. In addition, each of the different forms of ZnO used for advanced applications typically requires its own specialized method for production.

Bulk ZnO single crystals are typically produced using either the hydrothermal method or a melt based growth method. The melting point of ZnO is near 2000° C., but ZnO at these temperatures will decompose to Zn metal and oxygen at atmospheric pressure. Therefore, melt based methods for producing ZnO crystals require extremely high temperatures, as well as controlled atmosphere and/or pressure. Although the conditions used are less extreme, the hydrothermal method still requires heavy-duty autoclaves capable of withstanding the high temperatures (300-400° C.) and high pressures (80-100 MPa) used. The hydrothermal growth solutions are also extremely corrosive and these autoclaves must be lined with non-reactive materials like platinum. Compared to these methods, the low temperatures and atmospheric pressure used the current invention allow for less energy consumption, less expensive equipment, and a less hazardous process.

Industrially, ZnO thin films are often deposited by a physical vapor deposition method, like magnetron sputtering or pulsed laser deposition (PLD), but chemical vapor and chemical solution methods have also been explored. The major drawback of magnetron sputtering and PLD is the need to maintain the very low pressure growth environment needed to create the plasma which sputters material from the target. The creation and control of the plasma also require expensive equipment and significant amounts of power. Chemical vapor deposition techniques, such as metalorganic chemical vapor deposition (MOCVD) also require low pressure atmospheres and expensive equipment, as well as specialty gases and chemical precusors. The present invention is related to the aqueous solution deposition techniques of chemical bath deposition (CBD) and electrodeposition, which can also be used to produce ZnO films, but offers important advantages over these techniques. Like the current invention, both CBD and electrodeposition techniques produce ZnO from dissolved Zn complexes. However, electrodeposition is limited to conductive substrates. The CBD has more versatility for substrates, but has not been demonstrated for the deposition of epitaxial films. Typically, CBD also results in considerable amounts of precursors being wasted.

The current industrial uses for ZnO nanostructures and nanoparticles are fairly limited. However as utilization increases, the current method has potential to be more scalable than the other techniques for producing nanostructures and nanoparticles which are found in the academic literature on the subject. Methods found in the literature for producing ZnO nanostructures and particles include vapor techniques and both aqueous and non-aqueous solution techniques.

The current invention presents a low temperature aqueous method that could potentially be used to synthesize all of the forms of ZnO mentioned above. While this technique has aspects in common with the established aqueous solution techniques of hydrothermal crystal growth and chemical bath deposition, crucial aspects of the current invention give the method disclosed here important advantages over these prior art aqueous solution methods, as well as over non-solution based techniques.

SUMMARY OF THE INVENTION

The method of the present invention utilizes a unique continuous circulation method and reactor which allows for control over both the nucleation and growth mechanisms needed to synthesize ZnO films, nanostructures, and bulk single crystals. The method of the invention uses an aqueous growth solution composition to dissolve a zinc containing nutrient at a first temperature and synthesize ZnO at a second temperature, where the second temperature at which ZnO is synthesized is warmer than the first temperature at which the nutrient was dissolved, and wherein the synthesis of ZnO is caused by a reduction in the solubility of ZnO in the aqueous solution at the second, warmer, temperature compared to the first, cooler, temperature. In general, the reactor of the current invention consists of two distinct, but physically connected zones containing an aqueous growth solution. Control over ZnO nucleation and growth is achieved by varying the chemical driving force for ZnO synthesis from the aqueous growth solution using a combination of the solution composition, the temperatures of the two reactor zones, and circulation of the solution between the two zones. In the typical embodiment, the entire process is performed at temperatures below the boiling point of the growth solution and near ambient pressures.

The mild conditions possible with the disclosed process present several advantages over other methods. These advantages can include lower energy input, lower equipment cost, and better compatibility with temperature sensitive substrates, templates, or devices. Unlike other techniques capable of depositing ZnO from aqueous solution at low temperature, such as chemical bath deposition (CBD) or electrodeposition, which typically use zinc salts as the source of Zn, one embodiment of the current invention uses ZnO itself. As a common industrial material, ZnO powder is inexpensive and readily available. Using ZnO as the Zn source also allows the reactor to operate in a closed loop, recrystallizing the dissolved ZnO source material into ZnO of the desired form, but recycling all the other components of the growth solution. This means that the process produces no waste or by-products, further lowering the environmental impact and cost of the present method compared to existing methods.

The two prior art methods for synthesizing ZnO most closely related to the current invention are the hydrothermal growth method and chemical bath deposition (CBD). The hydrothermal growth method of producing bulk ZnO crystals also functions by recrystallizing ZnO powder, but that method operates at significantly higher temperatures and pressures than the present invention. The temperatures and pressures used in the hydrothermal method, which are often above the supercritical point of water, are necessary to achieve the levels ZnO solubility and mass transport required for appreciable crystal growth rates in that method. In hydrothermal growth of ZnO, the chemical reactions controlling the dissolution and recrystallization of ZnO place can be written as:

$$ZnO(cr)+(x-1)H_2O(l) \leftrightarrow Zn(OH)_x^{2-x}(aq)+ (x-2)H^+(aq),$$

where x=1, 2, 3 or 4. Under the highly alkaline conditions used in hydrothermal growth of ZnO, higher temperatures shift the equilibrium of this reaction to the right, and lower temperatures shift it to the left. In other words, the solubility of ZnO increases with temperature, and therefore, more ZnO can be dissolved in aqueous solution at higher temperatures than at lower temperatures. A typical hydrothermal growth procedure takes advantage of this solubility dependence to grow bulk crystals by dissolving ZnO powder, sometimes called the nutrient, in a higher temperature zone, and then recrystallizing ZnO as a bulk single crystal in a cooler zone. The overall reaction can then be written as below:

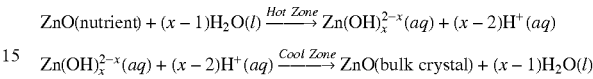

In the hydrothermal method, transport of the dissolved zinc species from the hotter to the cooler zone takes place by diffusion and convective flow in the solution.

Like the hydrothermal method, the current invention utilizes a temperature variation in ZnO solubility to dissolve and then recrystallize ZnO. However, for the aqueous solutions used in the new method, the solubility dependence is reversed. This behavior is due to the formation of soluble zinc complexes which are more stable at lower than higher temperatures. In one embodiment of the invention, the complexes used are zinc amine complexes. Under some pH and temperature conditions, zinc amine complexes can form through the reaction of dissolved ammonia with dissolved zinc ions or solid ZnO. In analogy to the reaction written above for the hydrothermal method, ZnO solubility in the present invention may be controlled by the reaction:

$$ZnO(cr)+xNH_3(aq)+2H^+(aq) \leftrightarrow Zn(NH_3)_x^{2+}(aq)+ H_2O(l),$$

where x=1, 2, 3 or 4. Under the correct conditions of solution pH, ammonia concentration, and temperature, the equilibrium of this reaction will shift to the left with increasing temperature and to the right with decreasing temperature. This relationship is predicted by the thermodynamic calculations disclosed in Ref [1].

Zinc amine complexes are also utilized in CBD of ZnO, but in that technique, the reaction written above only moves from right to left. Like the current invention, CDB of ZnO tends to operate under relatively mild conditions, i.e., temperatures between room temperature and 100° C., atmospheric pressure, and solution pH that is neither extremely acidic nor basic. When utilized in CBD, zinc amine complexes are formed by reacting ammonia with the dissolved zinc ions supplied by a soluble zinc salt, such as zinc nitrate, zinc chloride, zinc acetate, etc. The formation of Zn complexes is used to control or moderate the deposition of ZnO, which is typically initiated by an increase in the temperature or pH of the growth solution.

In the current invention, the zinc amine complexes essentially function as a carrier for transporting the dissolved zinc between the different zones of the reactor. In the cooler zone of the reactor, where the ZnO nutrient is contained, the above reaction moves from left to right so that zinc amine complexes are formed by dissolving ZnO. In the hotter zone of the reactor, ZnO is synthesized by the reaction moving right to left. When the growth solution is allowed to flow, or is otherwise circulated, between the cooler and hotter zones, the overall reaction is as written below:

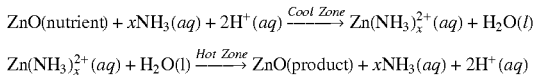

This overall reaction has been demonstrated to result in controllable ZnO synthesis by the embodiment of the invention disclosed in Ref. [2].

As described herein, ZnO has numerous applications requiring epitaxial and polycrystalline thin films, nanostructures, and bulk single crystals. The low temperature aqueous continuous circulation method and reactor which are the subject of this disclosure present a new low cost, environmentally friendly way of supplying the ZnO for these applications. Thus, to overcome the limitations in the prior art described above, and to overcome other limitations that will become apparent upon reading and understanding the present specification, the present invention discloses a method for fabricating ZnO films, nanostructures, and bulk single crystals.

The method comprises (a) using an aqueous growth solution composition to dissolve a zinc containing nutrient at a first temperature; and (b) synthesizing the ZnO at a second temperature, wherein the second temperature at which the ZnO is synthesized is higher or warmer than the first temperature at which the nutrient is dissolved, and the synthesis of ZnO is caused by a reduction in solubility of the ZnO in the aqueous solution at the second, warmer, temperature compared to the first, cooler, temperature.

The method may further comprise moving, or allowing to move, the aqueous solution composition between at least two zones including a first zone at the first, cooler, temperature containing the nutrient, and a second zone at the second, warmer, temperature where ZnO is synthesized, so that a net flux of ZnO occurs from the first zone to the second zone.

The method may further comprise one or more process steps including changing the respective temperatures of the first zone or the second zone, or the first zone and the second zone, by heating or cooling, or heating and cooling the first zone or the second zone.

A rate of the ZnO synthesis may be controlled by varying any combination of the aqueous solution's composition, the first temperature of the first zone and the second temperature of the second zone, heating or cooling rates, or the heating and the cooling rates, of the first zone and the second zone, and a rate at which the aqueous solution composition moves between the first zone and the second zone.

A nucleation rate of the ZnO, either on a substrate or template or as free nuclei, may be controlled by varying any combination of the aqueous solution's composition, the first temperature of the first zone and the second temperature of the second zone, a heating or a cooling rate, or the heating and the cooling rates, of the first zone and the second zone, and a rate at which the aqueous solution composition moves between the first zone and the second zone.

Both the first, cooler, temperature, at which the nutrient is dissolved, and the second, warmer, temperature, at which the ZnO is synthesized, may be between a freezing point and a boiling point of the aqueous solution composition.

The zinc containing nutrient may be ZnO. The nutrient may be ZnO that has been doped or alloyed with another substance. The aqueous solution composition may contain complexing ligands, have an appropriate pH, and otherwise comprise a composition where zinc complexes form, resulting in a higher solubility at the first, cooler temperature compared to the second, warmer, temperature. The complexing ligand used may be ammonia so that zinc amine complexes form in the aqueous solution composition.

The aqueous solution composition in the second zone may be heated to obtain the second temperature in the second zone that is warmer than the first temperature in the first zone. The aqueous solution composition in the first zone may be cooled to obtain the first temperature in the first zone which is cooler than the second temperature in the second zone. The aqueous solution composition in the first zone may be cooled and the aqueous solution composition in the second zone may be heated to obtain the second temperature in the second zone that is warmer than the first temperature in the first zone.

During one or more process steps, the aqueous solution composition may be prevented from moving between the first zone and the second zone.

The ZnO that is synthesized may be doped or alloyed with one or more components.

The ZnO synthesis may result in formation of a ZnO film on a substrate in contact with the aqueous solution composition. The substrate may have already been seeded with ZnO prior the synthesis of the ZnO. The resulting ZnO film may be epitaxial with the substrate. The substrate may be a Group III-Nitride based light emitting diode device. The ZnO synthesis may result in formation of ZnO microstructures or nanostructures and the microstructures or the nanostructures form either on, or within, a substrate template, or in a bulk of the aqueous solution composition. The ZnO synthesis may result in growth of a bulk ZnO single crystal.

The aqueous solution composition may contain additives which affect the synthesis of the ZnO but are not consumed during the ZnO synthesis and are not incorporated into the resulting ZnO that is synthesized, and the additives may include (but are not limited to) one or more of the following: metal citrate salts, citric acid, other salts or acids which produce stable anions that interact with the surfaces of the ZnO, surfactants, polymers, and/or biomolecules.

The aqueous solution composition may contain dissolved species which are incorporated into the ZnO that is synthesized. The dissolved species may include, but are not limited to, ions containing elements which are incorporated into the ZnO as dopants.

The current invention further comprises a continuous circulation reactor for fabricating ZnO, comprising a dissolution zone or vessel, for dissolving a ZnO nutrient into an aqueous growth solution; a deposition zone or vessel, for depositing ZnO from the aqueous growth solution onto a substrate or seed; and a connection to the dissolution zone such that movement of the aqueous growth solution from the dissolution zone to the deposition zone, and vice versa, occurs.

The dissolution zone and the deposition zone may be for operation at one or more temperatures between a freezing point and a boiling point of the aqueous growth solution. The dissolution zone and the deposition zone may be contained in one or more vessels which are fabricated from nonreactive materials that resist corrosion, dissolution, or other degradation by contact with the aqueous growth solution. The nonreactive materials include, but are not limited to, one or more of the following: fluoropolymers, other higher performance polymers, silicate glass, and/or stainless steel. All components of the reactor which come into contact with the aqueous growth solution during operation may be composed of the nonreactive materials.

The reactor may further comprise a peristaltic pump, tube pump, or other mechanical pumping mechanism capable of operating in a manner that does not contaminate the aqueous growth solution being pumped, positioned to pump the aqueous growth solution from the dissolution zone to the deposition zone, and capable of controlling a circulation rate of the aqueous growth solution between the dissolution zone and the deposition zone.

The reactor may further comprise a filter positioned between the dissolution zone and the deposition zone to prevent any, or limit the particle size of, undissolved nutrient being pumped from the dissolution zone to the deposition zone.

The reactor may further comprise an overflow mechanism positioned to return flow of the aqueous growth solution from the deposition zone to the dissolution zone, and for ensuring that a volume of the aqueous growth solution in each zone remains constant while avoiding the need for a second synchronized pump to return the aqueous growth solution to the dissolution zone.

The reactor may further comprise a heater for heating the deposition zone; and a temperature sensor in thermal contact with the deposition zone, wherein the heater is for heating the growth solution in the deposition zone, such that the growth solution in the deposition zone is a warmer growth solution and the aqueous growth solution in the dissolution zone is a cooler growth solution that is cooler than the warmer growth solution, and the temperature sensor enables measurement and control of a temperature in the deposition zone through an electronic temperature controller or computer connected to both the heater and the temperature sensor. The aqueous growth solution in the deposition zone of the reactor may be heated by absorption of radiation rather than by thermal contact with a heater, and in which case the heater is the radiation or a source of the radiation. A substrate or seed crystal in the deposition zone of the reactor may be first heated by the heater and heat then transferred from the substrate or seed to the surrounding aqueous growth solution.

BRIEF DESCRIPTION OF THE DRAWINGS

Referring now to the drawings in which like reference numbers represent corresponding parts throughout:

FIGS. 2(a) and 2(b) show the calculated solubility ZnO in aqueous solution as a function of pH and ammonia concentration at 25° C. and 90° C., respectively, wherein the highlighted areas draw attention to a range of pH and ammonia concentration where the solubility of ZnO is lower at 90° C. than 25° C.

FIG. 5(a) and FIG. 5(b) show cross-sectional schematic of Group III-Nitride (III-N) Light Emitting Diode (LED) devices utilizing epitaxial ZnO current spreading layers fabricated using the current invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

A novel process is presented for the synthesis of ZnO from low temperature aqueous solution using a continuous circulation method and reactor. By utilizing the temperature dependence of ZnO solubility in ammoniacal aqueous solution, between the freezing and boiling range of the solution, to drive a dissolution and recrystallization process, the method may be used to transform a Zn source, such as ZnO powder, into ZnO of another desired form, which could be a film, nanostructures, or a bulk single crystal. The reactor for performing this method is comprised of at least two temperature zones including a cooler zone in which the Zn source is dissolved, and a warmer zone where the ZnO product is formed. During operation, the aqueous growth solution may be circulated between these two zones. This circulation process allows soluble zinc complexes acting as zinc carriers, to transport zinc from the cooler zone, where the complexes are formed, to the warmer zone, where the complexes dissociate and ZnO is recrystallized. The nucleation and growth of ZnO in the reactor is controlled though a combination of the solution composition, the circulation of growth solution between the reactor zones, and the temperature management of the reactor zones. By controlling the nucleation and growth processes and supplying the appropriate substrate or seed crystal, this basic reactor design can be used to synthesize ZnO powders, nanoparticles, polycrystalline films, epitaxial films, and bulk single crystals. The reactor can use very simple, relatively non-toxic, inexpensive chemicals, and because it operates in a closed cycle, it produces little to no waste byproducts.

Technical Description

ZnO Synthesis Using a Continuous Circulation Reactor Method

Figure 1:
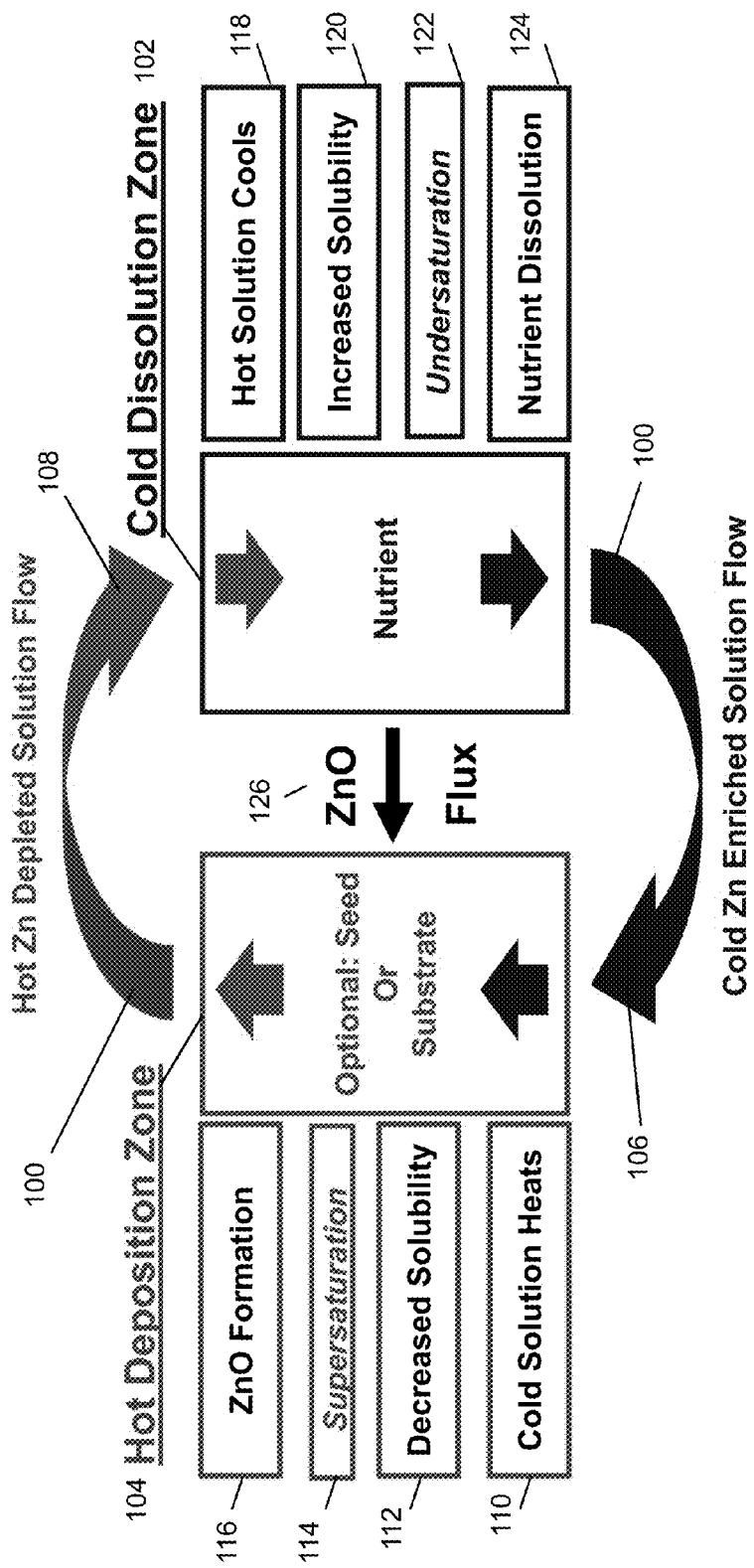
FIG. 1 is a flowchart and cross-sectional schematic illustrating a method of, and reactor for, fabricating, synthesizing, or fabricating ZnO according to the present invention.

FIG. 1 is a flowchart and schematic illustrating an embodiment of a method for, and reactor for, fabricating, synthesizing, growing, or depositing ZnO according to the present invention, comprising moving (e.g., continuously circulating 100), or allowing the movement of, a growth solution containing dissolved Zn species between a cooler (cold) dissolution vessel or zone 102, which contains ZnO nutrient material, and a warmer (hot) deposition vessel or zone 104, which may contain a substrate, seed crystal, or template, wherein the solubility of the ZnO in the growth solution is lower in the warmer deposition zone 104 than in the cooler dissolution zone 102, so that ZnO nutrient is dissolved in the cooler dissolution zone 102 and ZnO of the desired form is fabricated, synthesized, grown, or deposited in the warmer deposition zone 104. A cooler 102 and a warmer 104 zone within a single vessel can also be used. The circulating or moving 100 comprises cold solution flow 106 and hot solution flow 108. The warmer zone 104 is warmer or hotter than the colder or cooler zone 102. In one embodiment of the invention, the temperatures of the cooler zone 102 and warmer zone 104, as well as the circulation of solution between them, may all be varied independently.

Steady-state operation is obtained if the volumes and temperatures of the solutions within both the deposition zone 104 and the dissolution zone 102 are maintained at constant levels while growth solution is continuously circulated 100. During steady-state operation, the cooler solution heats 110 after entering the warmer vessel or zone 104. The heating of the entering solution causes equilibrium solubility of ZnO in that solution to lower or decrease 112. If the equilibrium solubility is lowered or decreased below the concentration of Zn in solution, the result is a supersaturation 114 of dissolved ZnO in the solution. To return the Zn concentration in solution towards equilibrium, ZnO formation 116 occurs. ZnO formation 116 may occur through the synthesis of new ZnO nuclei or the growth of existing ZnO crystals. As the warm solution then returns 108 to the cooler vessel 102, its temperature decreases (hot solution cools 118), raising or increasing the solubility 120 of ZnO in solution. This causes the solution to become under-saturated (undersaturation 122), so that ZnO source material or nutrient is now dissolved (ZnO nutrient dissolution 124) to return the solution towards equilibrium. This cycle can continue uninterrupted until all of the ZnO nutrient in the cooler dissolution zone 102 has been dissolved.

The overall effect of the above solution moving, or circulating, process is a net ZnO flux or flow 126 from the cooler dissolution zone 102 to the warmer deposition zone 104. If the solution in both the cooler dissolution zone and warmer deposition zone remains near equilibrium, the flux 126 will be equal to the rate of ZnO supersaturation in the deposition zone 104, and can be expressed with the following equation:

$$\text{Flux} = \frac{\partial \sigma}{\partial t} = r_{circ}(C_{ZnO}(T_{cool}) - C_{ZnO}(T_{hot}))$$

Here, t is time, $\sigma$ is the supersaturation, $r_{circ}$ is the rate of solution circulation, and $C_{ZnO}$ is the equilibrium solubility of ZnO expressed at $T_{cool}$, the temperature of the cooler dissolution zone 102, and at $T_{hot}$, the temperature of the warmer deposition zone 104. However, even without solution circulation 100, initial heating of the solution in the deposition zone 104 can also result in ZnO formation 116. In the case of initial heating without circulation, there will be no resulting ZnO flux 126, but the rate of ZnO supersaturation in the deposition zone 104 can be expressed with the following equation.

$$\frac{\partial \sigma}{\partial t} = \frac{\partial C_{ZnO}}{\partial T_{hot}} \frac{\partial T_{hot}}{\partial t} V_{hot}$$

The new variable, $V_{hot}$, is the volume of solution heated in the deposition zone 104. If the solution remains near equilibrium during heating, the rate of ZnO formation can be approximated by the equation for the rate of supersaturation. This rate of ZnO formation will vary with time and is therefore not steady-state. If the reactor is operating with circulation and variable temperatures, the two equations for the rate of ZnO formation in the deposition zone 104 are simply summed giving the new supersaturation equation below, which again approximates the rate of ZnO synthesis 116 in the deposition zone 104.

$$\frac{\partial \sigma}{\partial t} = \frac{\partial C_{ZnO}}{\partial T_{hot}} \frac{\partial T_{hot}}{\partial t} V_{hot} + r_{circ}(C_{ZnO}(T_{cool}) - C_{ZnO}(T_{hot}))$$

Since the ZnO flux 126 occurs via dissolution and recrystallization, the process can transform any arbitrary form of ZnO into another. In the preferred embodiment, low cost ZnO powder is dissolved in the cooler dissolution zone 102 and higher value nanostructures, films, or bulk single crystals are formed 116 in the hotter deposition zone 104. It is also possible to use other zinc containing substances as the Zn nutrient in the dissolution zone 102. Possibilities include zinc containing substances with partial solubility in aqueous solution like $Zn(OH)_2$, hydrated zinc oxide or zinc hydroxide, zinc citrate, etc. However, only ZnO can be used with the reactor operating in a closed loop, as shown in FIG. 1, without changing the solution composition over time. With another nutrient besides ZnO, the equations as written above for supersaturation rate must be modified.

Solution Composition

The correct solution composition is critical for the continuous circulation reactor to operate according to the mechanism illustrated in FIG. 1. The two most important aspects of the solution composition for the present invention are the pH of the solution and the concentration of appropriate complexing ligands. With an aqueous solution which does not contain the appropriate complexing ligands, ZnO will tend to be more soluble at higher temperatures than lower, and the reactor design of the present invention would not synthesize ZnO. It is therefore necessary to provide a source of ligands to form zinc complexes which act to increase the solubility of ZnO at lower temperatures more than at higher ones.

A working embodiment of the invention uses a solution containing dissolved ammonia ($NH_3$) to provide amine ligands for this task, but it is intended that current invention extend to the use of other sources of amine ligands, as well as other ligands which result in a similar ZnO solubility dependence on temperature. Amine is the name given to the $NH_3$ molecular unit when it is functioning as a ligand in a complex. Aqueous solutions of ammonia dissolved in water are also commonly referred to as an ammonium hydroxide ($NH_4OH$) solution, ammonia water, aqua ammonia, household ammonia, or simply ammonia. Ammonia ligands can also be supplied to an aqueous solution by dissolving ammonium salts. Examples include, but are not limited to, simple inorganic and organic salts such as ammonium chloride ($NH_4Cl$), ammonium nitrate ($NH_4NO_3$), ammonium acetate ($CH_3COONH_4$), ammonium carbonate (($NH_4)_2CO_3$), Triammonium citrate (($NH_4)_3C_6H_5O_7$), etc. Ammonia ligands could also be supplied as part of a soluble coordination compound or double salt. Additionally, ammonia ligands could be supplied by the en situ decomposition of another compound, urea or hexamine for example. Other ligands besides amine which form aqueous complexes of Zn(II) and which result in a temperature range of decreasing solubility of ZnO with increasing temperature may also be used. Other ligands likely to behave in this manner include, but are not limited to, water soluble primary amines, secondary amines, tertiary amines, and polyamines. Amines are ammonia based organic compounds where at least one hydrogen is replaced with an alkyl or aryl group. Non-nitrogen containing ligands which form complexes which result in the required solubility behavior for ZnO can also be used.

Figure 2A:
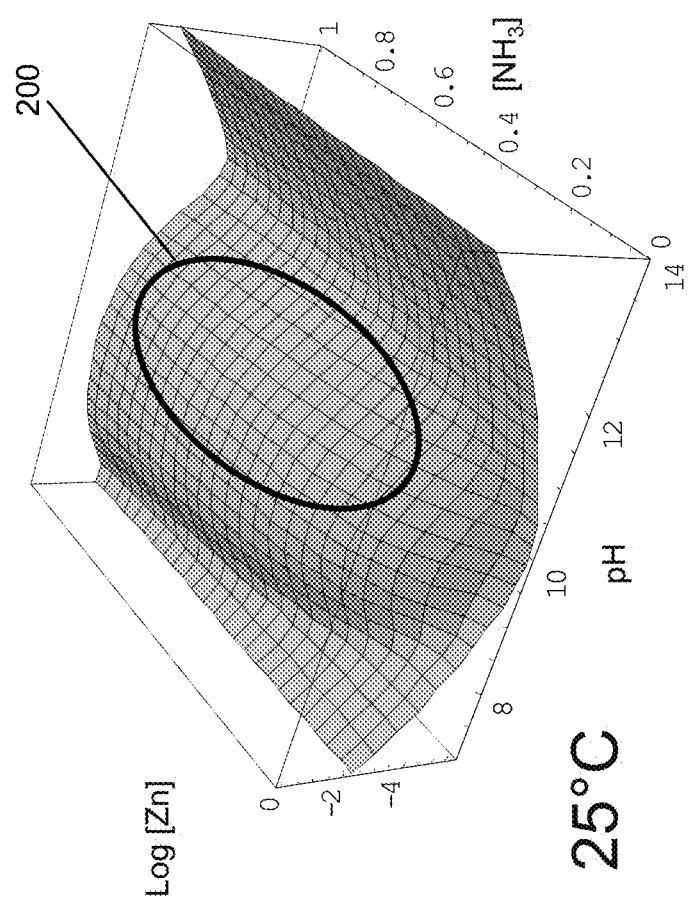

The thermodynamic calculations disclosed in Ref [1] predicted that aqueous solutions containing ammonia can have substantially higher solubility for ZnO at room temperature (25° C.) than at near boiling temperatures (90° C.). FIG. 2, which is modified from Ref. [1], shows the results of ZnO solubility calculation made as a function of pH, ammonia concentration, and temperature. FIG. 2(a) shows the calculated solubility at a temperature of 25° C. and FIG. 2(b) shows the same at 90° C. The regions 200 and 202 highlight the same example pH and ammonia concentration range in FIG. 2(a) and FIG. 2(b), respectively, and clearly show that ZnO solubility is significantly lower for the 90° C. calculation area 202.

The experimental results disclosed in Ref. [2] demonstrated that an embodiment of the current invention can deposit ZnO from solutions containing between 0.25 and 1.0 mol/L ammonia and having pH between 10 and 12. These conditions are understood to be only examples of the many pH and ammonia concentration solution conditions capable of producing ZnO with the present invention and do not represent any sort of fundamental or practical limit on the possible conditions. However, both the calculation in Ref[1] and the experimental results in Ref. [2] do make it clear that a solution that does not contain ammonia, or another source of appropriate complexing ligands, will not produce ZnO using the method of this invention.

In a simplest embodiment of the invention, the aqueous growth solution contains only the dissolved zinc source, ammonia or another source of similarly acting complexing ligands, and whatever acid or base is necessary to achieve the desired pH. To avoid making the ZnO solubility behavior more complicated, only acids and bases which do not form complexes with zinc under the pH and temperature conditions utilized should be used. In addition to these simplest compositions, it is also possible to use more complex growth solutions containing additives to modify ZnO growth or composition. This could include additives such as citrate ions, which are well known to affect the morphology of ZnO synthesized in aqueous solution. For example, citrate ions can be utilized in the growth solution though the addition of soluble metal citrate salts or citric acid. Citric acid is thought to preferentially adsorb to certain crystallographic surfaces of ZnO during growth and thereby act to slow growth on those surfaces. Because the citrate only adsorbs to the surface of ZnO, but does not become incorporated, the citrate ions in solution are conserved and recycled. Examples of other additives likely to show similar behavior include other poly-anionic molecules, surfactants, water soluble polymers, and biomolecules.

Additives can also be made to the growth solution with the intention of changing the composition of the ZnO synthesized. Additions of this type could include sources of group III elements such as Al, Ga, or In, which are known to n-type dope ZnO, Group I elements such as Li, which is known reduce the conductivity of ZnO, or isovalent elements, like Mg or Cd, which are known to modify the bandgap of ZnO when used as dopants. The addition of dopant additives such as those mentioned above could be achieved by completely dissolving a highly soluble dopant containing chemical to the growth solution. For example, Al could be supplied by the complete dissolution into solution of Al nitrate. The addition of dopant to the solution could also be achieved in the same manner as the zinc, i.e., dissolving a source of the dopant and maintaining the concentration of dopant with an excess of the dopant source in the dissolution zone along with the zinc nutrient. For example, $Al_2O_3$ powder could be mixed with the ZnO powder in the dissolution zone. A third method would be to dope the Zn nutrient before using it in the reactor, e.g., using an Al doped ZnO powder as the nutrient. The second and third methods have the advantage of maintaining the concentration of dopant in solution throughout the growth. However, if only a small amount of dopant is being incorporated into the ZnO relative to the solution concentration, the solution concentration will change very little, and the first method may work just as well.

Controlling Nucleation and Growth of ZnO

According to classical nucleation theory, the free energy change ΔG related to the creation of a nucleus of one phase in another can be expressed as the sum of a volumetric energy term, which goes as the radius, r, of the nucleus cubed, and a surface energy term, which goes as the radius squared:

$$\Delta G = \frac{4}{3}\pi r^3 G_v + 4\pi r^2 \gamma$$

The volume term is proportional to the volumetric chemical free energy, $G_v$. When the chemical reaction leading to the new phase is energetically favorable, $G_v$ is negative, when the reverse reaction is favorable, $G_v$ is positive. The further the reaction from equilibrium, the greater the magnitude of $G_v$, and when the reaction is in chemical equilibrium, $G_v$ is zero. A nucleation process implies that new surface is created, so the surface energy term is always positive and proportional to the surface energy, γ. Because of the dependence on the square of the nucleus radius compared to the cube dependence of the volume term, the surface term will always dominate for small radii and the volume term will dominate at large radii. At a critical radii given by, $$r^* = -\frac{2\gamma}{G_v},$$

ΔG has a maximum given by, $$\Delta G^* = \frac{16\pi \gamma^3}{9 G_v^2}.$$

The quantity ΔG* represents the energy barrier to the formation of a stable nucleus, which controls the nucleation rate, I, through an Arrhenius type relation given by, $$I \propto e^{\frac{-\Delta G^*}{k_B T}}.$$

Although these equations are specific to homogeneous nucleation, the behavior for other forms of nucleation can be expressed similarly. In the solution phase, non-homogeneous nucleation will always results in a lower value for ΔG*, and thus, a higher nucleation rate. From least to most thermodynamically favorable, the types of nucleation possible in this system are, homogeneous, heterogeneous, heteroepitaxial, and homoepitaxial (growth).

As discussed above, heating the growth solutions used in the present invention lowers the solubility of ZnO in solution. Unless ZnO is precipitated or deposited from solution, a supersaturation condition is created. In the thermodynamic terms used above, a supersaturation means that the equilibrium has shifted towards the synthesis of ZnO so that $G_v$ is negative. The greater the supersaturation, the more negative $G_v$ is. The more negative $G_v$ is, the lower the energy barrier to nucleation is, and thus, the greater the nucleation rate. However, if a growth solution is heated relatively slowly, the magnitude of $G_v$ that can actually occur is limited. This is due to the fact that once $G_v$ reaches some critical value, nucleation of ZnO will start to occur at an appreciable rate. If a ZnO seed is present, homoepitaxial nucleation, or growth, will occur at very low supersaturations. Given a appropriate substrate, heteroepitaxial nucleation can occur but will require a higher superstation. If the substrate present has no epitaxial relationship with ZnO, heterogeneous nucleation will typically require an even higher supersaturation. If no heterogeneous nucleation sites are available, homogeneous nucleation can occur but requires the highest supersaturation. Once nucleation begins, growth of the nuclei allows the system to move back towards equilibrium, thereby reducing the supersaturation and $G_v$. As long as the maximum kinetically allowed growth rate of ZnO is faster than the rate of change of the supersaturation, the solution will remain near equilibrium. The rate of change in supersaturation can be quantified in the supersaturation rate equation introduced above and rewritten here:

$$\frac{\partial \sigma}{\partial t} = \frac{\partial C_{ZnO}}{\partial T_{hot}} \frac{\partial T_{hot}}{\partial t} V_{hot} + r_{circ}(C_{ZnO}(T_{cool}) - C_{ZnO}(T_{hot}))$$

Therefore, if the supersaturation rate is low, and the solution remains near equilibrium, the rate of ZnO synthesis in the deposition zone of the reactor will be equal to the supersaturation rate above. As a consequence, at low supersaturation rates, the rate of ZnO synthesis can be affected by the solution composition, circulation rate, the volume of the deposition zone, the temperature of the deposition and dissolution zone, and the rate of temperature change of the deposition zone.

The description above can provide guidelines for selecting the conditions used to fabricate different forms of ZnO. For example, when growing a bulk single crystal, the supersaturation rate should be kept low in order to prevent secondary nucleation and dendritic growth, which occurs at fast growth rates and lowers crystal quality. Forming an epitaxial film on a substrate may require a higher initial supersaturation rate to initiate nucleation, followed by lower supersaturation rate to facilitate high quality single crystal film growth. The synthesis ZnO nanowires on a substrate could require a lower nucleation density than a film, so the wires stay separated, but a higher supersaturation rate after nucleation to promote 1-dimensional growth. Synthesis of free nanoparticles would require a very high supersaturation rate to initiate the nucleation of many particles, but the supersaturation would then need to immediately drop to prevent further growth of the particles.

Mechanisms for Heating and Cooling the Growth Solution

Temperature control of the solution in the continuous circulation reactor can be achieved in numerous ways. In the simplest embodiment, only the temperature of the deposition zone is actively controlled, and the temperature of the dissolution zone remains near the ambient temperature. This still allows for several options for heating the deposition zone. The continuous circulation reactor may use a heating element in thermal contact with deposition vessel to heat the enclosed solution. This method has the simplest equipment requirements, but may have difficulty achieving very rapid or uniform heating rates, depending on the size, shape, and composition of the deposition vessel. Since the heat originates from the walls of the vessel when using such external heating, there is a finite limit to the rate heat can be transferred to the solution. Even with mixing, the solution in contact with the wall will heat first, increasing the chance of nucleating ZnO on the walls of the reactor vessel.

Another embodiment uses heating the solution though absorption of radiation, for example, commonly used 2.45 GHz microwave radiation. Microwave radiation heats the solution directly through the dielectric heating effect and may allow for more uniform temperature distributions over a wider range of heating rates. Microwave heating may be controlled by varying the power level of the microwave radiation or by variably pulsing a constant microwave power. An important feature of any heating method to be used is an accurate feedback mechanism for controlling the temperature. For microwave heating this still may be achieved using a thermocouple to measure the temperature of the growth solution, as is done in Ref. [2], but this may require screening the thermocouple from the microwave electric and magnetic fields, so other electronic or optical temperature measuring schemes may be better suited.

Yet another embodiment uses direct heating of a substrate or seed crystal which is in physical contact with the growth solution. In this embodiment, the heater is in direct thermal contact with the substrate or another material in thermal contact with the substrate and not in direct thermal contact with the solution or the reactor vessel walls. Heat is transferred from the substrate or seed crystal to the adjacent growth solution. This flow of heat should cause synthesis of ZnO to preferentially occur in the immediate vicinity of the substrate or seed. For film or single crystal growth, this method may increase growth rates and reduce the amount of ZnO formed away from the intended substrate or seed crystal.

Working Embodiments of a Continuous Circulation Reactor

Figure 3:
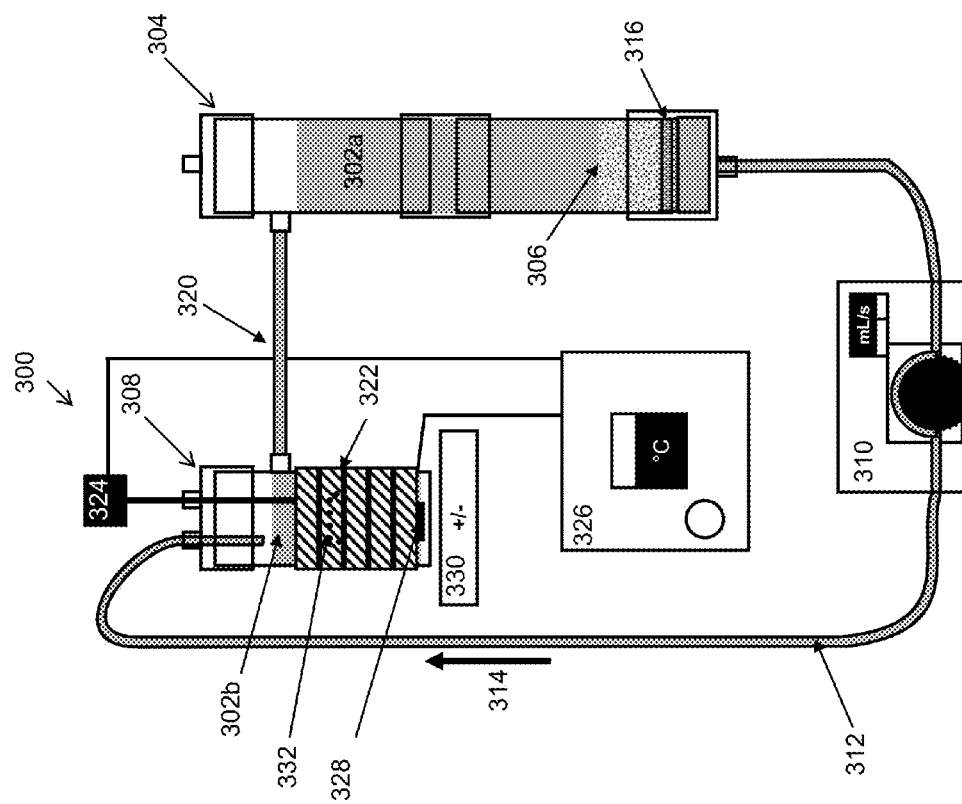
FIG. 3 is a cross-sectional schematic of an apparatus for fabricating ZnO according to the present invention, modified from Ref. [2].

FIG. 3 illustrates a working embodiment of an apparatus 300 comprising a continuous circulation reactor. To minimize contaminates in the growth solution 302a, 302b, the reactor is constructed entirely of chemically inert fluoropolymer, perfluoroalkoxy (PFA) (e.g., pre-molded PFA components obtained from Savillex Corporation). To prevent evaporation of the growth solution, the reactor is sealed off from the surrounding atmosphere during operation. The reactor comprises of two vessels: a first "cold" dissolution vessel 304, where the ZnO powder (Zn nutrient 306) is dissolved into an aqueous solution 302a, and a second "hot" deposition vessel 308, where ZnO is synthesized from the growth solution 302b. In this embodiment, the growth solution 302a, 302b is comprised of an aqueous solution of ammonia also containing any nitric acid and/or sodium hydroxide added to adjust the pH to the desired level along with whatever soluble zinc species are formed by allowing the solution to dissolve ZnO by equilibrating with an excess of ZnO powder. In this embodiment, the dissolution vessel 304 and the deposition vessel 308 are typically (although not necessarily) for operation at one or more temperatures below the boiling point of the growth solution and ambient (e.g., atmospheric) pressure. In this embodiment, the dissolution vessel 304 corresponds to the dissolution zone 102 in FIG. 1 and the deposition vessel 308 corresponds to the deposition zone 104 in FIG. 1.

The reactor further comprises a mechanical fluid pump 310, positioned to pump the solution 302a from the first vessel 304 to the second vessel 308 and to control the circulation rate of the solution 302a, 302b between the dissolution vessel 304 and the deposition vessel 308. In this embodiment, the pump 310 is a peristaltic pump so that the solution was only exposed to the inside of the Teflon vessel 304, 308 and the tubing 312. The circulation direction 314 is also shown. The solution 302a is pumped from the dissolution vessel 304 through an in-line filter 316, comprised of a series of porous polytetrafluoroethylene (PTFE) membranes 316, in order to prevent any ZnO powder (nutrient) 304 from being transferred to the deposition vessel 308. Another tube connects the deposition vessel 308 to the dissolution vessel 304 near the top of each vessel and acts as an overflow mechanism 320, so that the solution 302b may flow from the deposition vessel 308 to the dissolution vessel 304 via the overflow mechanism 320. Thus, return flow of the growth solution from the deposition vessel 308 to the dissolution vessel 304 may be accomplished by an overflow mechanism 320, ensuring that the volume of growth solution 302a, 302b in each vessel 304, 308 remains constant during operation.

The reactor further comprises a heater 322 in thermal contact with the deposition vessel 308, which is then in thermal contact to the growth solution 302b. In this embodiment, the heater 322 was an electrical heating element in the form of a tape wrapped around the outside of deposition vessel 308. A temperature sensor 324 is in thermal contact with the growth solution 302b. In this embodiment, the temperature sensor 324 was a PTFE coated type k thermocouple. Both the heating tape 322 and the thermocouple 324 are electrically connected to an electronic temperature controller 326. The electronic controller is thus capable of operating a feedback loop between the signal from the thermocouple 324 measuring the temperature of the deposition vessel solution 302b and the electrical heating tape 322 heating the deposition solution 302b. This allows for the deposition solution 302b to be heated at a constant rate and held at a constant temperature. To maintain a uniform concentration and temperature profile in the solution 302b within the deposition vessel 308, the solution 302b is continuously stirred using PTFE coated magnetic "stir-bar" 328 coupled with a magnetic stir-plate 330 positioned below the deposition vessel 308. In this embodiment, the dissolution vessel solution 302a is cooled by heat transfer to the ambient atmosphere via the walls of the dissolution vessel 304. This mechanism of cooling only works when the rate of heat dissipation from 304 to the ambient can match the rate that heat is added by the flow of solution into the dissolution vessel 304. This can be true when the rate of solution circulation is slow and/or the surface area of the dissolution vessel 304 is large.

For deposition on a substrate, the embodiment illustrated FIG. 3 utilizes a sample holder 332, also made from PFA, which suspends the substrate in the relative center of the deposition vessel 308 leaving the surface of the substrate completely exposed to the growth solution 302b. Various substrates can be used in the present embodiment. This includes substrates which allow epitaxial ZnO formation such as (111) oriented single crystal $MgAl_2O_4$ wafers, (0001) oriented sapphire wafers with epitaxial (0001) oriented GaN buffer layers, single crystal GaN wafers with various orientations including, (0001), (10-10), (10-11), and III-N LED devices based on any of the preceding substrates. Epitaxial growth may also be performed on a single crystal ZnO wafer, or an other wise formed single crystal ZnO seed. Possible substrates also include materials which do not allow epitaxial ZnO formation, including glasses and polymers based substrates.

The continuous circulation reactor embodiment illustrated in FIG. 3 and described above was used to produce the experimental results disclosed in Ref.[2] for the deposition of epitaxial (0001) oriented ZnO onto (111) oriented single crystal $MgAl_2O_4$ substrates. Using this embodiment, epitaxial ZnO was successfully deposited using aqueous solutions with a room temperature pH 11 having ammonia concentrations of 0.25, 0.5, and 1.0 mol/L, and solutions with room temperature pH 10 and 12 having an ammonia concentration of 0.5 mol/L. Further, the results in Ref. [2] demonstrate that the growth rate of ZnO can be controlled by the solution composition (pH and ammonia concentration), the circulation rate, and the temperature and heating rate of the deposition vessel solution.

Experimental Microwave Heating Results

Experimental results have also been obtained using microwave heating to facilitate ZnO synthesis from the filtered solution compositions utilized in the deposition zone of the present invention. These experiments were performed without circulation with the dissolution zone. The rapid heating possible using microwave radiation was shown to result in a high density of epitaxial nuclei on (111) $MgAl_2O_4$ and GaN substrates and a rapid growth of a film. However, the density of nuclei and rate of growth were controlled by varying the conditions of solution, pH, ammonia concentration, and heating rate. Scanning electron microscope (SEM) images of ZnO synthesized using microwave heating are shown in FIG. 4(a) and FIG. 4(b).

Figure 4C:
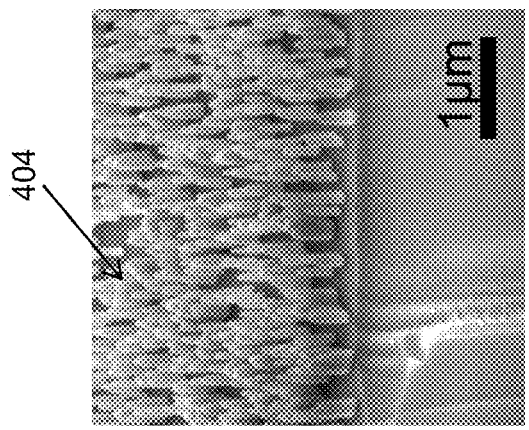
FIGS. 4(a)-(c) show scanning electron microscope images of epitaxial ZnO on $MgAl_2O_4$ substrates produced by microwave heating of an aqueous growth solution.
Figure 4B:
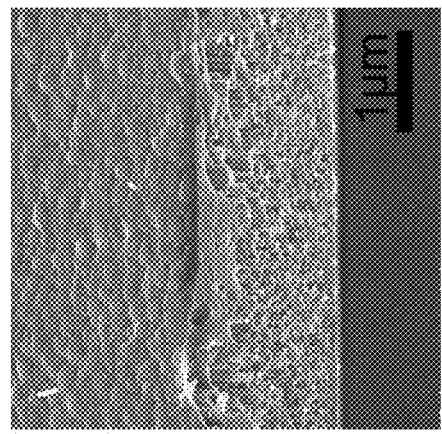
Figure 4A:
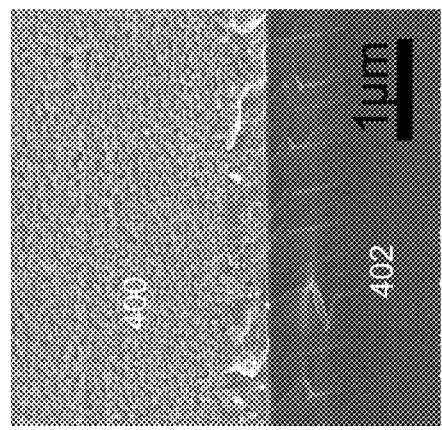

FIG. 4(a) shows an 45° tilted cross-section SEM image of an epitaxial ZnO film 400 deposited on a (111) oriented $MgAl_2O_4$ substrate 402 by rapidly heating a pH 11 solution containing 1 mol/L dissolved ammonia and saturated with dissolved ZnO using 2.45 GHz microwave radiation supplied by a Biotage Initiator® single mode microwave reactor. The solution was heated to 90° C. in approximately 40 seconds, and then immediately allowed to cool to approximately 50° C. before removing the substrate. Even in such a short growth period, the film has already grown to a thickness of approximately 600 nm.

FIG. 4(b) shows a similarly formed epitaxial film where the growth solution was held at 90° C. for 25 minutes for cooling to ~50° C. and removing the substrate. The addition time in solution at 90° C. has allowed this film to grow to approximately 2 μm in thickness.

FIG. 4(c) shows how different conditions, in this case solution pH, result in epitaxial nanorods rather than a film. These ZnO nanorods were synthesized on a (111) oriented $MgAl_2O_4$ by heating a ZnO saturated pH 12, 0.5 mol/L ammonia solution. As before, the solution was heated to 90° C. in approximately 40 seconds, and was then held at 90° C. for 1 minute before cooling to ~50° C. and removing the substrate.

III-N LED Current Spreading Layers Fabricated Using the Present Invention

Epitaxial ZnO films fabricated using the present invention have displayed carrier concentrations greater than $10^{18}$ cm$^{-3}$ and electron mobilities greater than 50 cm²/Vs, as measured by Hall effect measurements. Optical transmission measurements on epitaxial ZnO films produced using the current invention have shown the films to transmit over 90% of the light in the visible spectrum. These values give films of ZnO a low enough sheet resistance and a high enough transparency to function as a transparent current spreading layer when deposited on a III-N LED. The benefit of an epitaxial ZnO current spreading layer deposited on a GaN based blue LED from low temperature aqueous solution was recently demonstrated by Thompson et al. in Ref [3], where such a layer was shown to improve the external quantum efficiency of a blue LED by ~93% compared to a NiO/Au current spreading layer.

FIG. 5(a) illustrates the architecture of the LED 500 fabricated in Ref [3], comprising a sapphire substrate 502, n-GaN layer 504 on the substrate 500, active layer 506 on the n-GaN layer 504, p-AlGaN layer on the active layer 506, and p-GaN layer 508 on the AlGaN layer. Layers 502-508 form the substrate upon which n-type ZnO 510 may be grown/deposited, in aqueous solution (e.g. at 90° C.) according to the method of the present invention. The substrate (layers 502-508) may be placed in (e.g., submerged in) growth solution, in the deposition vessel of the present invention's reactor, so that the n-ZnO 510 may be grown on layer 508. Also shown are the p-type contact pad 512 and n-type contact pad 514.

Figure 5D:
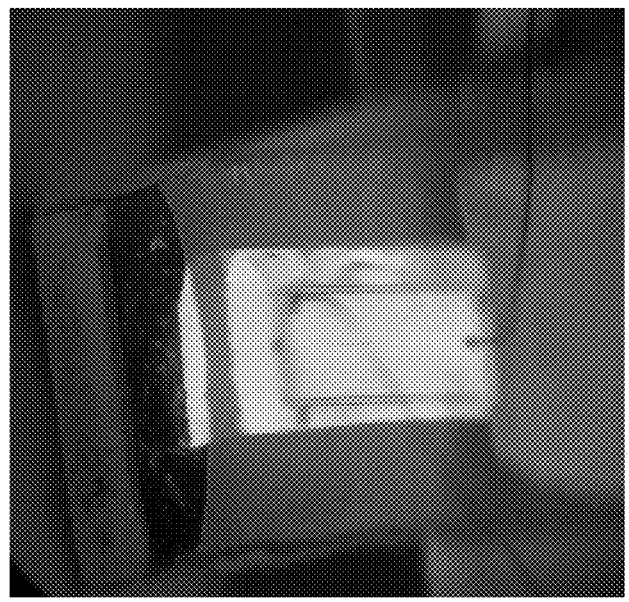
FIG. 5(c) and FIG. 5(d) show optical images of III-N LED devices utilizing epitaxial ZnO current spreading layers fabricated using the current invention emitting blue light during operation.
Figure 5C:
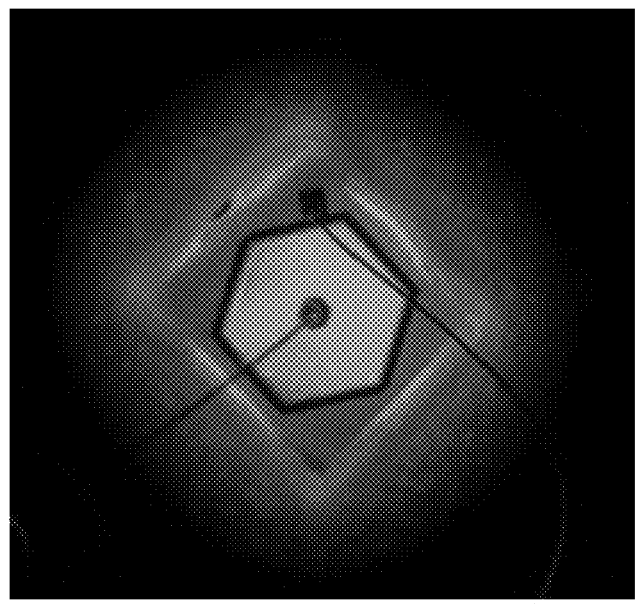

FIG. 5(b) illustrates the similar architecture of a device fabricated using a single crystal GaN substrate 516. FIG. 5(c) shows an optical image of the device fabricated in Ref. [3] producing blue light under current injection. FIG. 5(d) shows a similar optical image of an LED producing blue light, where the device shown comprises an epitaxial ZnO current spreading layer deposited using the current invention onto a (10-11) oriented LED fabricated on a single crystal GaN substrate.

This device produced 106 mW of light at 100 mA of applied current as measured by an integrating sphere detector. In Ref [3], the use of the ZnO layer improved the external quantum efficiency of the device by 93% compared to the industry standard thin NiO/Au current spreading layer. However, it is likely that this can be improved further by incorporating light extraction structures into the ZnO layer. Such structures can easily be produced using aqueous processing of ZnO films, by either bottom up growth or top down etching.

ZnO Film Properties

The electrical properties of ZnO will be important for many applications. The carrier type, concentration, and mobility of epitaxial ZnO films fabricated using the present invention have been measured using van der Pauw method Hall effect measurements. The films measured were not intentionally doped. Like most unintentionally doped ZnO, the films display n-type conductivity behavior. Carrier concentrations of as deposited films produced with the current invention were in the $10^{18}$-$10^{19}$ range. The most likely source of electron donors, i.e., the n-type dopant, is hydrogen incorporated into the ZnO films during synthesis. The theoretical role of hydrogen in ZnO is described in Ref [5]. Doping with hydrogen supplied by the aqueous growth solution, allows ZnO films with relatively high carrier concentrations to by synthesized without intentionally doping with a column Mb element like B, Al, Ga, or In. The electron mobility in as deposited films has typically been measured to be in the 25-50 $cm^2$/Vs range. These electron mobility values roughly correspond to the range seen in vapor deposited films, and achieve about 25-50% of the electron mobility observed in bulk single crystals with roughly the same carrier concentration, according to Ref [6], indicating that the ZnO films are of good quality.

Another important property for applications where the ZnO acts as a transparent conductor, such as when integrated onto a III-N LED as described above, is transparency to visible light. An epitaxial ZnO film fabricated with the current invention with a thickness of approximately 5 μm was measured to transmit greater than 92% of the total light in the range of 390 nm to 700 nm, which roughly corresponds to wavelengths visible to the human eye. The same film was measured to absorb between 94% and 95% of the ultra violet light with wavelengths between 300 nm and 375 nm. The sharp onset of absorption below 375 nm corresponds to a direct optical band gap of 3.31 eV, which is the value typically reported for hexagonal wurtzite structure crystalline ZnO. The high level of absorption at wavelengths below the band gap and high transparency above the band gap indicates a high quality film. For example, the films created with the present invention transmit more visible light than the undoped, or Ga doped ZnO films produced by pulsed laser deposition in Ref. [7].

Process Steps

FIG. 1 illustrates a method of fabricating ZnO. The method may comprise the following steps.

1. The use of an aqueous solution composition to dissolve 124 a zinc containing nutrient at a first temperature. The zinc containing nutrient may be ZnO. The aqueous solution may contain complexing ligands, have an appropriate pH, and otherwise comprise a composition where zinc complexes may form which result in higher solubility at a first, cooler, temperature compared to a second, warmer, temperature. The complexing ligand used may be ammonia so that zinc amine complexes form in solution. The nutrient may be ZnO that has been doped or alloyed with another substance.

2. Moving, or allowing to move 100, the aqueous solution between at least two zones including the first zone 102 at the first, cooler, temperature containing the nutrient and a second zone 104 at the second, warmer, temperature wherein ZnO is synthesized, so that a net flux of ZnO occurs from the first zone 102 to the second zone 104. However, during one or more process steps the aqueous growth solution may be prevented from moving between the first 102 and second 104 zone.

3. One or more process steps may comprise changing the respective temperatures of the first 102 and/or second 104 zones by heating 110 and/or cooling 118 the first 102 or second zones 104. The solution in the second zone 104 may be heated 110 to obtain a temperature in the second zone 104 that is warmer than the temperature in the first zone 102. The solution in the first zone 102 may be cooled 118 to obtain a temperature in the first zone 102 which is cooler than the temperature in the second zone 104. The solution in the first zone 102 may be cooled 118 and the solution in the second zone 104 may be heated 110 to obtain a temperature in the second zone 104 that is warmer than the temperature in the first zone 102. Both the first, cooler, temperature, at which the nutrient is dissolved 124, and the second, warmer, temperature, at which ZnO is synthesized 116, may be between the freezing and boiling point of the aqueous solution composition used.

4. Synthesis 116 of the ZnO at a second temperature (e.g., using the aqueous solution composition), where the second temperature at which ZnO is synthesized 116 is higher or warmer than the first temperature at which the nutrient was dissolved 124, and wherein the synthesis 116 of ZnO is caused by a reduction in the solubility 112 of ZnO in the aqueous solution at the second, warmer, temperature compared to the first, cooler, temperature. The rate of ZnO synthesis 116 may be controlled by varying any combination of aqueous growth solution composition, the temperatures of the first 102 and second 104 zones, the heating 110 and/or cooling 118 rates of the first 102 and second 104 zones, and the rate at which the solution moves 100 between the first and second zones. The nucleation 116 rate of ZnO, either on a substrate or template or as free nuclei, may be controlled by varying any combination of solution composition, the temperatures of the first 102 and second 104 zones, the heating 110 and/or cooling 118 rates of the first 102 and second 104 zones, and the rate at which the solution moves 100 between the first 102 and second 104 zones.

The ZnO synthesized 116 may be doped or alloyed with other components. For example, the growth solution may contain dissolved species which are incorporated into the ZnO that is synthesized. These dissolved species include, but are not limited to, ions containing elements which are incorporated into ZnO as dopants.

ZnO synthesis 116 may result in the formation of a ZnO film on a substrate in contact with the aqueous solution 302b. For example, the film 400 may be in contact with a $MgAl_2O_4$ substrate 402. The substrate may have already been seeded with ZnO. The resulting ZnO film may be epitaxial with the substrate. The substrate may be a III-N based LED device, for example, as shown in FIG. 5(a) and FIG. 5(b).

ZnO synthesis 116 may result in the formation of ZnO microstructures or nanostructures 404, as shown in FIG. 4(c). The microstructures or nanostructures can form either on or within a substrate template or form in the bulk of the solution.

ZnO synthesis 116 may result in growth of a bulk ZnO single crystal.

The aqueous solution may contain additives which affect the synthesis 116 of ZnO but are not consumed during ZnO synthesis 116 and are not incorporated into the resulting ZnO. These additives could include, but are not limited to, metal citrate salts, citric acid, other salts or acids which produce stable anions which interact with the surfaces of ZnO, surfactants, polymers, and biomolecules.

The above process steps may be performed in a continuous circulation reactor for fabricating ZnO, comprising a dissolution zone 102 or vessel 304, for dissolving a ZnO nutrient into an aqueous growth solution 302a; and a deposition zone 104 or vessel 308, for depositing ZnO from the growth solution 302b onto a substrate or seed; and a connection 312, 320 to the dissolution zone 102, 304 such that movement of the growth solution 302a, 302b from the dissolution zone 102 to the deposition zone 104, and vice versa, occurs. The dissolution zone 102 and the deposition zone 104 may be for operation at one or more temperatures between the freezing and boiling points of the aqueous growth solution 302a, 302b.

As shown in FIG. 3, the dissolution zone 102 and the deposition zone 104 may be contained in one or more vessels 304, 308 which may be fabricated from nonreactive materials that will resist corrosion, dissolution, or otherwise be degraded by contact with the aqueous growth solution 302a, 302b. Such materials include, but are not limited to, fluoropolymers, other higher performance polymers, silicate glass, and stainless steel. All components of the reactor which come into contact with the aqueous growth solution 302a, 302b during operation may be comprised or composed of the nonreactive materials.

The reactor may further comprise a peristaltic pump 310, tube pump, or other mechanical pumping mechanism capable operating in a manner that does not contaminate the aqueous growth solution 302a, 302b being pumped, positioned to pump the growth solution from the dissolution zone 102 to the deposition zone 104, to control the circulation 100 rate of the growth solution 302a between the dissolution zone 102 and the deposition zone 104.

The reactor may further comprise a filter 316 positioned between the dissolution zone 102 and the deposition zone to prevent any, or limit the particle size of, undissolved nutrient being pumped from the dissolution zone 102 to the deposition zone 104.

The reactor may further comprise an overflow mechanism 320 positioned to return flow 108 of the growth solution 302b from the deposition zone 104 to the dissolution zone 102, and for ensuring that a volume of the growth solution 302a, 302b in each zone 102, 104 remains constant while avoiding the need for a second synchronized pump to return the growth solution 302b to the dissolution zone 102.

The reactor may further comprise a heater 322 in thermal contact with the deposition zone 104; and a temperature sensor 324 in thermal contact with the deposition zone 104, wherein the heater 322 is for heating the growth solution 302b in the deposition zone 104, such that the growth solution 302b in the deposition zone 104 is a warmer growth solution and the growth solution 302a in the dissolution zone 102 is a cooler growth solution that is cooler than the warmer growth solution, and the temperature sensor 324 enables measurement and control of the temperature in the deposition zone 104 through an electronic temperature controller or computer connected to both the heater 322 and the temperature sensor 324. However, in one modification, the solution 302b in the deposition zone 104 of the reactor may be heated by absorption of radiation, for example by absorption of 2.45 GHz microwave radiation, rather than by thermal contact with a heater 322.

In another possible modification, the substrate or seed crystal in the deposition zone 104 of the reactor is first heated and heat is then transferred from the substrate or seed to the surrounding aqueous solution 302b.

REFERENCES

The following references are incorporated by reference herein.

[1] "Controlling Low Temperature Aqueous Synthesis of ZnO: Part 1, Thermodynamic Analysis," by Jacob J. Richardson and Frederick F. Lange, Cryst. Growth Des. 2009, 9(6), pp. 2570-2575.

[2] "Controlling Low Temperature Aqueous Synthesis of ZnO: Part II, A Novel Continuous Circulation Reactor," by Jacob J. Richardson and Frederick F. Lange, Cryst. Growth Des. 2009, 9(6), pp. 2576-2581.

[3] "Light Emitting Diodes with ZnO Current Spreading Layers Deposited from a Low Temperature Aqueous Solution," by Daniel B. Thompson, Jacob J. Richardson, Steven P. Denbaars, and Frederick F. Lange, Applied Physics Express 2 (2009), 042101.

[4] "Low Temperature Aqueous Deposition Of ZnO on GaN LEDs," by Jacob Richardson, Daniel Thompson, Ingrid Koslow, Jun Seok Ha, Steve DenBaars, and Fred Lange, presentation slides at SSLEC annual review, November 2009.

[5] "Hydrogen as a Cause of Doping in Zinc Oxide," by Chris G. Van de Walle, Physical Review Letters (2000), 85(5), pp. 1012-1015.

[6] "Resistivity of Polycrystalline Zinc Oxide Films: Current Status and Physical Limit", by K. Elmmer, Journal of Physics. D (2001), 34(21), pp. 3097-3108.

[7] Cheung, Jeffery T., "Transparent and Conductive Zinc Oxide Film with Low Growth Temperature", U.S. Pat. No. 6,458,673 B1, 2002.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating ZnO, comprising:
(a) using an aqueous solution composition to dissolve a zinc containing nutrient at a first temperature, wherein the aqueous solution composition contains one or more sources of complexing ligands, has an appropriate pH, and otherwise comprises a composition that results in the formation of soluble zinc-ligand complexes, wherein the complexing ligands and the formation of the soluble zinc-ligand complexes increases the ZnO solubility in the aqueous solution composition at the first temperature; and
(b) synthesizing the ZnO at a second temperature, wherein the second temperature at which the ZnO is synthesized is higher or warmer than the first temperature at which the nutrient is dissolved, and the synthesis of the ZnO is caused by a reduction in solubility of the ZnO in the aqueous solution composition at the second, warmer, temperature compared to the first, cooler, temperature as a result of the complexing ligands having a greater impact on ZnO solubility at the first temperature than at the second temperature.

2. The method of claim 1, further comprising:
moving, or allowing to move, the aqueous solution composition between at least two zones including a first zone at the first, cooler, temperature and containing the nutrient, and a second zone at the second, warmer, temperature where ZnO is synthesized.

3. The method of claim 2, further comprising one or more process steps including changing the respective temperatures of the first zone or the second zone, or the first zone and the second zone, by heating or cooling, or heating and cooling the first zone or the second zone.

4. The method of claim 2, wherein a rate of the ZnO synthesis is controlled by varying any combination of the aqueous solution composition, the first temperature of the first zone and the second temperature of the second zone, heating or cooling rates, or the heating and the cooling rates, of the first zone and the second zone, and a rate at which the aqueous solution composition moves between the first zone and the second zone.

5. The method of claim 2, wherein a nucleation rate of the ZnO, either on a substrate or template or as free nuclei, is controlled by varying any combination of the aqueous solution composition, the first temperature of the first zone and the second temperature of the second zone, a heating or a cooling rate, or the heating and the cooling rates, of the first zone and the second zone, and a rate at which the aqueous solution composition moves between the first zone and the second zone.

6. The method of claim 1, wherein both the dissolution of the zinc containing nutrient and the synthesis of the ZnO are at near atmospheric pressure and both the first, cooler, temperature, at which the nutrient is dissolved, and the second, warmer, temperature, at which the ZnO is synthesized, are between a freezing point and a boiling point of the aqueous solution composition.

7. The method of claim 1, wherein the zinc containing nutrient is ZnO.

8. The method of claim 1, wherein the complexing ligand used is ammonia so that zinc ammine complexes form in the aqueous solution composition when the zinc containing nutrient is dissolved in the aqueous solution composition.

9. The method of claim 2, wherein the aqueous solution composition in the second zone is heated to obtain the second temperature in the second zone that is warmer than the first temperature in the first zone.

10. The method of claim 2, wherein the aqueous solution composition in the first zone is cooled to obtain the first temperature in the first zone which is cooler than the second temperature in the second zone.

11. The method of claim 2, wherein the aqueous solution composition in the first zone is cooled and the aqueous solution composition in the second zone is heated to obtain the second temperature in the second zone that is warmer than the first temperature in the first zone.

12. The method of claim 2, wherein during one or more process steps, the aqueous solution composition is prevented from moving between the first zone and the second zone.

13. The method of claim 1, wherein the ZnO that is synthesized is intentionally doped or alloyed with one or more components.

14. The method of claim 1, wherein the ZnO synthesis results in formation of a ZnO film on a substrate in contact with the aqueous solution composition.

15. The method of claim 14, wherein the substrate has already been seeded with ZnO prior to the synthesis of the ZnO in claim 1 step (b).

16. The method of claim 14, wherein the resulting ZnO film is epitaxial with the substrate.

17. The method of claim 14, wherein the substrate is a Group III-Nitride based light emitting diode device.

18. The method of claim 1, wherein the ZnO synthesis results in formation of ZnO microstructures or nanostructures and the microstructures or the nanostructures form either on, or within, a substrate template, or in a bulk of the aqueous solution composition.

19. The method of claim 1, wherein the ZnO synthesis results in growth of a bulk ZnO single crystal.

20. The method of claim 1, wherein the aqueous solution composition contains additives which affect the synthesis of the ZnO but are not consumed during the ZnO synthesis and are not incorporated into the resulting ZnO that is synthesized, and the additives include one or more of the following: surfactants, polymers, biomolecules, metal citrate salts, citric acid, or other salts or acids which produce stable anions, in the aqueous solution composition, that interact with a ZnO surface.

21. The method of claim 1, wherein the aqueous solution composition contains dissolved species which are incorporated into the ZnO that is synthesized, and the dissolved species include ions containing elements which are incorporated into the ZnO as dopants.

22. The method of claim 1, wherein the nutrient is ZnO that has been intentionally doped or alloyed with another substance.

23. An apparatus for performing the method of claim 2, comprising:
(a) one or more a dissolution zones, for performing claim 1 step (a);
(b) one or more synthesis or deposition zones, for performing claim 1 step (b); and
(c) one or more physical connection(s)between the dissolution zone(s) and the synthesis or deposition zone(s), capable of allowing movement of the aqueous solution composition from the dissolution zone(s) to the synthesis or deposition zone(s) and/or from the synthesis or deposition zone(s) to the dissolution zone(s).

24. The apparatus of claim 23, wherein the dissolution zone(s) and the deposition zone(s) are contained in one or more vessels which are fabricated from nonreactive materials that resist reaction, corrosion, dissolution, or other degradation by contact with the aqueous solution composition of claim 1.

25. The apparatus of claim 24, wherein the nonreactive materials include one or more of the following: fluoropolymers, other higher performance polymers, silicate glass, or stainless steel.

26. The apparatus of claim 24, wherein all components of the apparatus which come into contact with the aqueous solution during operation are comprised of the nonreactive materials.

27. The apparatus of claim 23, further comprising at least one pumping mechanism capable of moving the aqueous solution composition from the dissolution zone(s) to the synthesis or deposition zone(s), and/or from the synthesis or deposition zone(s) to the dissolution zone(s).

28. The apparatus of claim 23, further comprising at least one filter or separation mechanism capable of preventing any, or limiting or selecting the particle size of, undissolved nutrient in the aqueous solution composition being transferred from the dissolution zone(s) to the synthesis or deposition zone(s).

29. The apparatus of claim 23, further comprising:
at least one heating mechanism capable of heating one or more of the synthesis or deposition zones or dissolution zones; and/or
at least one cooling mechanism capable of cooling one or more of the synthesis or deposition zones or dissolution zones.

30. The apparatus of claim 29, wherein at least one of the heating mechanisms provides radiation that either directly or indirectly results in heating of the aqueous solution composition.

31. The apparatus of claim 30, wherein the radiation is 2.45 GHz microwave radiation.

32. The apparatus of claim 29, wherein at least one of the heating mechanisms provides heat, or heat inducing radiation, to one or more substrates or seed crystals in the apparatus and the heat of the substrate(s) or seed crystal(s) is subsequently transferred from the substrate(s) or seed crystal(s) to the surrounding aqueous solution composition.

33. The apparatus of claim 23, further comprising at least one mechanism for selectively opening or closing at least one of the physical connections to either controllably prevent or allow the movement of aqueous solution composition between the dissolution zone and the synthesis or deposition zone.

34. The apparatus of claim 29, further comprising at least one temperature sensor capable of directly or indirectly measuring a temperature of the synthesis or deposition zone(s) or the dissolution zone(s) and transmitting that temperature information to an electronic temperature controller or computer capable of controlling the operation of the at least one heating mechanism or cooling mechanism of the apparatus.

35. A method of fabricating ZnO, comprising:
(a) using an aqueous solution composition to dissolve a zinc containing nutrient at a first temperature, wherein the aqueous solution composition used possesses a basic pH and contains zinc complexing ligands; and
(b) synthesizing the ZnO at a second temperature, wherein the second temperature at which the ZnO is synthesized is higher or warmer than the first temperature at which the nutrient is dissolved, and the synthesis of the ZnO is caused by a reduction in solubility of ZnO in the aqueous solution composition at the second, warmer, temperature compared to the first, cooler, temperature, and wherein the complexing ligands have a greater impact on ZnO solubility at the first temperature than at the second temperature.

36. The method of claim 35, further comprising:
moving, or allowing to move, the aqueous solution composition between at least two zones including a first zone at the first, cooler, temperature and containing the nutrient, and a second zone at the second, warmer, temperature where ZnO is synthesized.

37. An apparatus for performing the method of claim 36, comprising:
one or more synthesis or dissolution zone(s), for performing claim 38 step (a);
one or more synthesis or deposition zone(s), for performing claim 38 step(b); and
one or more physical connection(s) between the dissolution zone(s) and the synthesis or deposition zone(s) capable of allowing movement of the aqueous solution composition from the dissolution zone(s) to the synthesis or deposition zone(s), and/or from the synthesis or deposition zone(s) to the dissolution zone(s).

38. The method of claim 35, wherein the aqueous solution composition contains complexing ligands so that zinc ammine complexes form in the aqueous solution composition.

39. A method of fabricating ZnO, comprising:
(a) using an aqueous solution composition to dissolve a zinc containing nutrient at a first temperature, wherein the aqueous solution composition contains one or more sources of complexing ligands and the complexing ligands increase the ZnO solubility in the aqueous solution composition at the first temperature; and
(b) synthesizing the ZnO at a second temperature, wherein the second temperature at which the ZnO is synthesized is higher or warmer than the first temperature at which the nutrient is dissolved, and the synthesis of the ZnO is caused by a reduction in solubility of ZnO in the aqueous solution composition at the second, warmer, temperature compared to the first, cooler, temperature as a result of the solubility of the ZnO in the aqueous solution composition at the second temperature converging towards the solubility of the ZnO in an aqueous solution without the complexing ligand.

* * * * *